US 9,847,070 B2

(12) United States Patent
Park et al.

(10) Patent No.: US 9,847,070 B2
(45) Date of Patent: Dec. 19, 2017

(54) DISPLAY WITH INTRAFRAME PAUSE CIRCUITRY

(71) Applicant: Apple Inc., Cupertino, CA (US)

(72) Inventors: Kwang Soon Park, Cupertino, CA (US); Chun-Yao Huang, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 84 days.

(21) Appl. No.: 14/520,797

(22) Filed: Oct. 22, 2014

(65) Prior Publication Data

US 2016/0118011 A1  Apr. 28, 2016

(51) Int. Cl.
*G09G 3/36* (2006.01)
*G06F 3/041* (2006.01)
*G11C 19/18* (2006.01)

(52) U.S. Cl.
CPC ......... *G09G 3/3688* (2013.01); *G06F 3/0412* (2013.01); *G11C 19/184* (2013.01); *G09G 2300/0814* (2013.01); *G09G 2300/0819* (2013.01); *G09G 2300/0842* (2013.01); *G09G 2310/0267* (2013.01); *G09G 2310/0286* (2013.01); *G09G 2310/0294* (2013.01); *G09G 2310/063* (2013.01); *G09G 2310/065* (2013.01); *G09G 2310/08* (2013.01); *G09G 2320/0209* (2013.01)

(58) Field of Classification Search
CPC ... G09G 2300/0814; G09G 2300/0819; G09G 2320/0209
See application file for complete search history.

(56) References Cited

U.S. PATENT DOCUMENTS

| 5,359,242 A * | 10/1994 | Veenstra ............ H03K 19/1736 326/39 |
| 8,040,293 B2 | 10/2011 | Jeong |
| 8,462,096 B2 | 6/2013 | Otose |
| 8,542,178 B2 | 9/2013 | Yoo et al. |
| 2005/0156858 A1 | 7/2005 | Ahn et al. |
| 2006/0007102 A1* | 1/2006 | Yasuoka ............... G02F 1/1336 345/102 |
| 2010/0007635 A1* | 1/2010 | Kwon .................. G09G 3/3677 345/204 |
| 2012/0038616 A1* | 2/2012 | Song ...................... G09G 3/003 345/212 |

(Continued)

*Primary Examiner* — William Boddie
*Assistant Examiner* — Leonid Shapiro
(74) *Attorney, Agent, or Firm* — Treyz Law Group, P.C.; Jason Tsai (57) ABSTRACT

A display may have an array of pixels to display images. Gate line driver circuitry may have stages that supply gate line signals. A gate line may be located in each row of the pixels. Each stage may have an output block that produces a respective one of the gate line signals and may have a carry block that separately produces a carry signal that is provided to a later stage in the gate line driver circuitry. A memory may be provided in at least some of the stages to store signals produced by the output blocks during intraframe pausing operations. At the end of an intraframe pause, the stored signals may be used in restarting production of the gate line signals by output blocks in the gate line driver stages. Circuitry may be used to separately reset the output block and suppress carry signal production by the carry block.

20 Claims, 12 Drawing Sheets

(56) References Cited

U.S. PATENT DOCUMENTS

2014/0035889 A1    2/2014  Huang et al.
2014/0049512 A1*   2/2014  Yang .................... G06F 3/0416
                                                    345/174
2015/0213762 A1*   7/2015  Xia ..................... G09G 3/3266
                                                    345/215

* cited by examiner

DISPLAY WITH INTRAFRAME PAUSE CIRCUITRY

BACKGROUND

This relates generally to electronic devices, and, more particularly, to electronic devices with displays.

Electronic devices such as cellular telephones, computers, and other electronic equipment often contain displays. A display such as a touch screen display includes an array of pixels for displaying images to a user and touch sensor electrodes such as capacitive touch sensor electrodes for gathering touch input from the user. Touch sensor circuitry is used to process touch sensor signals from the touch sensor electrodes. Display driver circuitry such as source line driver circuitry may supply data signals to the array of pixels. Gate line driver circuitry can be used to assert a gate line signal on each row of pixels in the display in sequence to load data into the pixels.

In displays such as touch screen displays, there is a potential for the pixel array to create interference for the touch sensor. The signal-to-noise ratio of the touch sensor can be enhanced by periodically pausing the operation of the display. Pause operations that have the potential to take place in the midst of displaying a frame of data on the display are sometimes referred to as intraframe pause operations.

During an intraframe pause, gate line signals, data signals, and clock signals are held at direct current (DC) levels. This reduces noise and enhances the signal-to-noise ratio for the touch sensor, but has the potential to create undesired voltage stress on certain transistors in the gate line driver circuitry. The gate line driver circuitry includes shift register circuitry that is based on a series of coupled gate line driver stages. The output of each stage is typically used both to drive the gate line associated with that stage and to serve as a carry signal for a subsequent stage. If care is not taken, an output transistor in a paused gate line driver stage will be subjected to a long voltage stress during pausing, because the output of the previous stage will be supplied to the gate of the output transistor until the intraframe pause is over. This stress is different from the voltage stress experienced by the output transistors in the gate line driver stages that have been turned off. Unequal transistor stresses such as these can result in undesired visible artifacts such as dim lines on a display.

It would therefore be desirable to be able to provide a display such as a touch screen display having gate line driver circuitry that minimizes or avoids unequal transistor stresses.

SUMMARY

A display may have an array of pixels to display images. A touch sensor may overlap the array of pixels. Data may be supplied to columns of the pixels. Gate line driver circuitry may supply gate line signals to pixels using gate lines. A gate line may be located in each row of the pixels. The gate line driver circuitry may contain gate line driver stages.

Each stage may have an output block that produces a respective one of the gate line signals and may have a carry block that separately produces a carry signal that is provided to the next stage in the gate line driver circuitry.

A memory may be provided in at least some of the stages to store signals produced by the output blocks during intraframe pausing operations. At the end of an intraframe pause, the stored signals may be used in restarting production of the gate line signals by output blocks in the gate line driver stages. Because these signals are stored in memory, it is not necessary to hold these signals on the gates of the output transistors.

Circuitry may be used to separately reset the output block and suppress carry signals produced by the carry block. The ability to reset each gate line signal during intraframe pauses may help prevent unequal transistor stresses within bootstrapping circuitry in the output blocks. The ability to suppress the carry signals helps prevent the carry signals from triggering gate line signals before the end of an intraframe pause.

DETAILED DESCRIPTION

Figure 1:
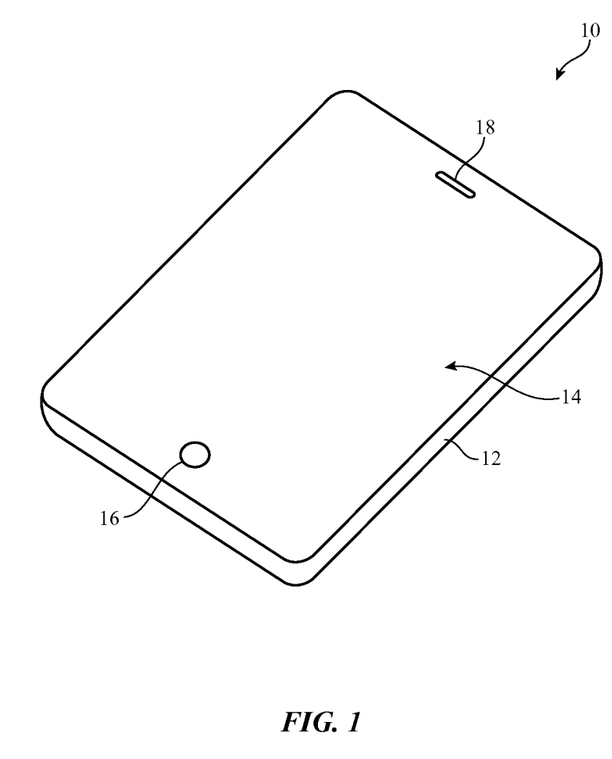
FIG. 1 is a perspective view of an illustrative electronic device in accordance with an embodiment.

An electronic device such as electronic device 10 of FIG. 1 may contain a display with driver circuitry that supports intraframe pauses. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components. Capacitive touch screen electrodes may be formed from indium tin oxide electrodes or other transparent conductive structures.

Display 14 may include an array of pixels formed from liquid crystal display (LCD) components or pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18. Openings may be formed in housing 12 to form communications ports (e.g., an audio jack port, a digital data port, etc.), to form openings for buttons, etc.

Figure 2:
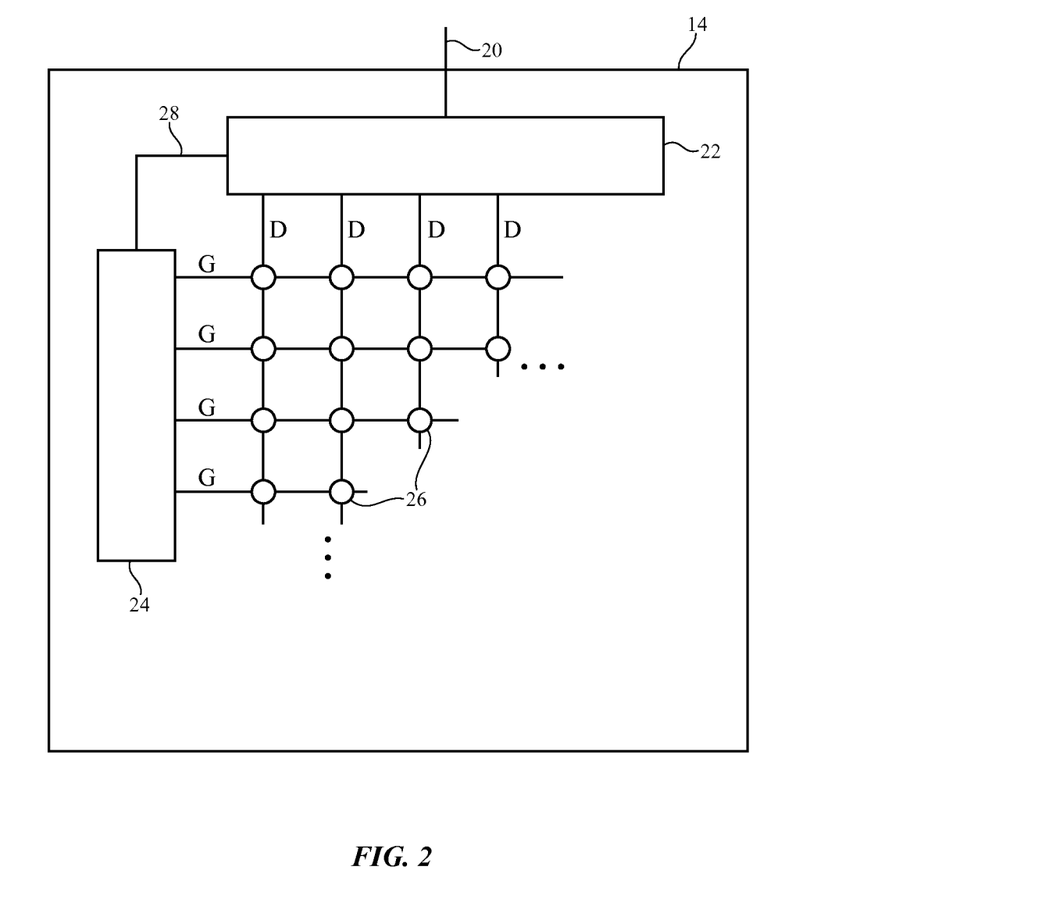
FIG. 2 is diagram of a display in accordance with an embodiment.

FIG. 2 is a top view of display 14. In the illustrative configuration of FIG. 2, display 14 has been provided with an array of pixels 26 that receive data signals D on vertical data lines and that receive gate line signals G on horizontal gate lines. Display driver circuitry for display 14 such as circuitry 22 may receive image data to be displayed on display 14 using paths such as path 20. Display driver circuitry 22 may supply control signals to display driver circuitry such as gate line driver circuitry 24 on path 28 (e.g., clock signals, signals for initiating and halting intraframe pause operations, etc.). Gate line driver circuitry 24 may be formed along the left edge of display 14 or on both the right and left edges of display 14. Circuitry 22 and 24 may be implemented using integrated circuits and/or thin-film transistor circuitry on a glass substrate or other substrate for display 14. For example, circuitry 22 (or part of circuitry 22) may be implemented using an integrated circuit, whereas gate line driver circuitry 24 may be implemented using thin-film transistors (e.g., silicon thin-film transistor such as polysilicon thin-film transistors, semiconducting oxide transistors such as indium gallium zinc oxide transistors, etc.).

During operation, gate line driver circuitry 24 asserts gate line signals G on the gate lines associated with the rows of pixels 26 in the array of pixels on display 14. Each gate line signal may be taken high in sequence. As the gate line in a row is taken high, the data signals D on the columns of the pixel array are loaded into pixels of that row. This row-by-row loading process allows frames of image data to be loaded into display 14 and displayed for a user.

Touch sensor 27 may overlap pixels 26. Touch sensor circuitry 29 may process the touch sensor signals from touch sensor electrodes associated with the touch sensor. With one suitable arrangement, an array of touch sensor electrodes (e.g., rows and columns of indium tin oxide electrodes or electrodes with other patterns) may overlap display 14 and pixels 26. To prevent display noise from interfering with the operation of the touch sensor, display driver circuitry 22 and 24 may be used to periodically pause the process of asserting the gate line signals and the loading of data into pixels 26. During intraframe pausing, data line signals D from circuitry 22 and the gate line signals G from circuitry 24 are paused to prevent alternating current (AC) signal interference with the touch sensor.

Figure 3:
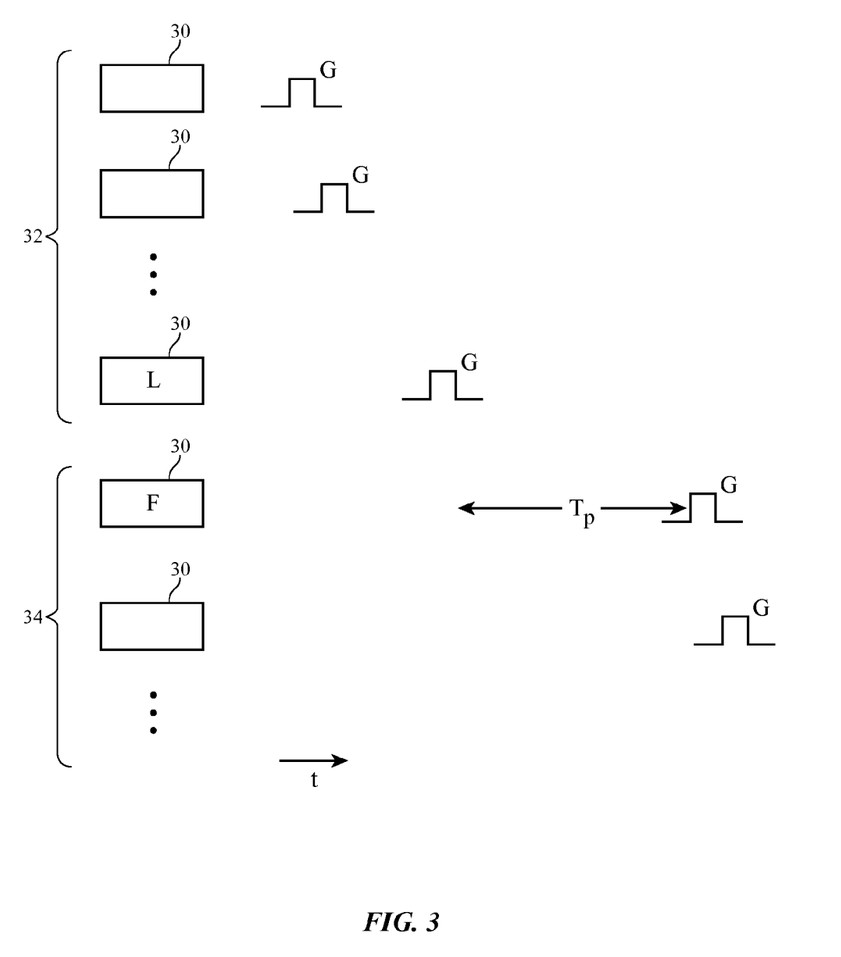
FIG. 3 is a diagram of illustrative gate line signals produced in a display with an intraframe pause in accordance with an embodiment.

Gate line driver circuitry 24 has a chain of gate line driver stages such as stages 30 of FIG. 3. Each stage produces a gate line signal G for a respective gate line in display 14. The gate line driver stages form a shift register circuit in which signals from previous stages are used in triggering outputs from subsequent stages. Stages 30 and the gate lines associated with stages 30 may be organized in groups (e.g., groups of tens or hundreds). When initiating an intraframe pause, it may be desirable to halt the operation of gate line driver circuitry 24 at a row or set of multiple rows (e.g., a set of four rows) that lies at the end of a group. In the example of FIG. 3, display 14 has being paused after gate line driver stage L has issued gate signal G. Stage L (in this example) is the last stage in group 32. Stage F is the first stage in subsequent group 34. The pause time (in this example) is the amount of time Tp between the gate signal that is produced by stage L of group 32 and the gate signal that is produced by stage F.

Conventional gate line driver circuitry is susceptible to damage from unequal gate line driver circuit transistor stress. A gate line driver circuit may have an output transistor with a gate. During normal operation of this type of conventional gate line driver circuitry, when each stage in a shift register is periodically producing an output signal and passing that output signal to the next stage in the shift register as a carry signal, pause operations may result in application of a persistent voltage on the gate of the output transistor in the paused stage (e.g., stage L of FIG. 3). This can damage the transistor and lead to a dim row in a display (e.g., the row associated with stage L).

In accordance with an embodiment, unequal voltage stresses on the gates of the output transistors in the gate line driver stages can be reduced or eliminated by providing the gate line driver circuits (or at least the gate line driver circuits at the end of each group) with capacitor-based memory circuits and decoupled carry blocks and output blocks. When an intraframe pause is being initiated, the gate line output signals from the output blocks can be reset rather than leaving the transistors in the paused gate line stages exposed to elevated gate voltages. The carry signals produced by the carry blocks can be suppressed to prevent premature triggering of subsequent output stages. When it is time to terminate the intraframe pause, preloaded data in the memory can be used as trigger signals to restart the shift register.

Figure 4:
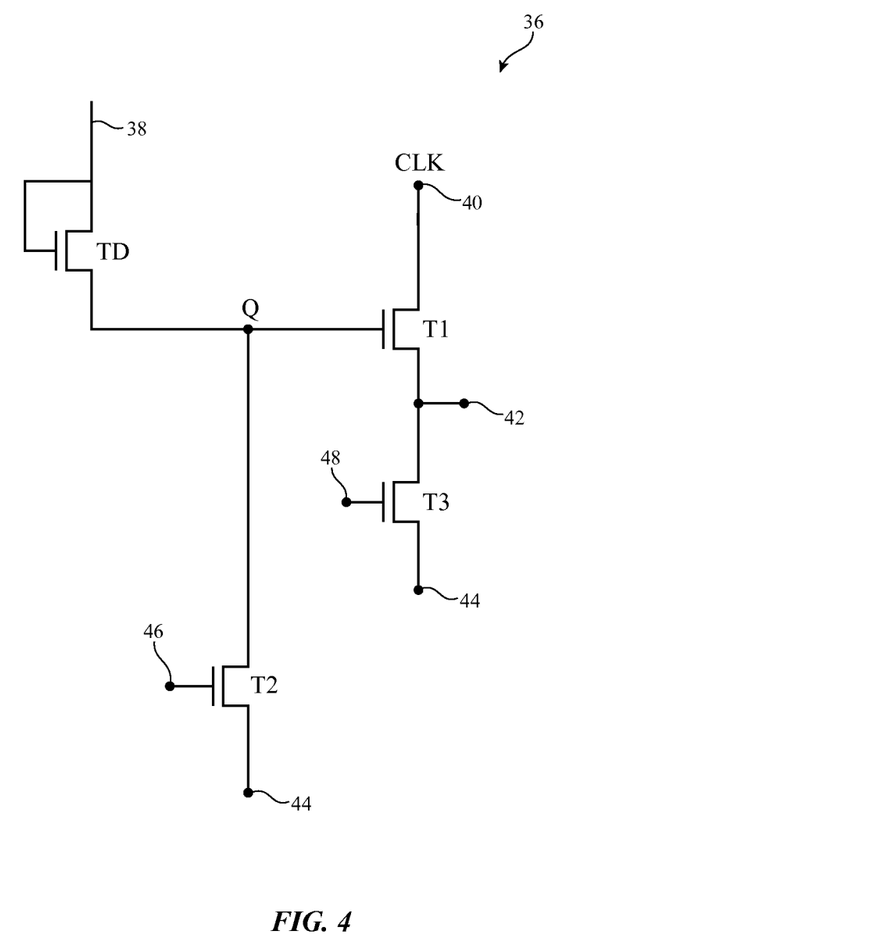
FIG. 4 is a diagram of an illustrative circuit that may be used in forming part of a gate line output block and as part of a carry block in a gate line driver stage in accordance with an embodiment.

FIG. 4 is a circuit of the type that may be incorporated into the output block and into the carry block of each gate line driver stage.

As shown in FIG. 4, circuit 36 may include an input such as input 38, and an output such as output 42. Clock signals may be applied to clock input 40. Terminals 38 and 40 can receive positive signals (e.g., 20 volt signals or other signals), whereas terminals 44 may be power supply terminals that receive lower voltages (e.g., voltages of −4 to −10 volts, etc.). Transistor T1 may have a gate coupled to data storage node Q. Transistor T2 may have a gate coupled to control input 46. Transistor T3 may have a gate coupled to control input 48.

Figure 5:
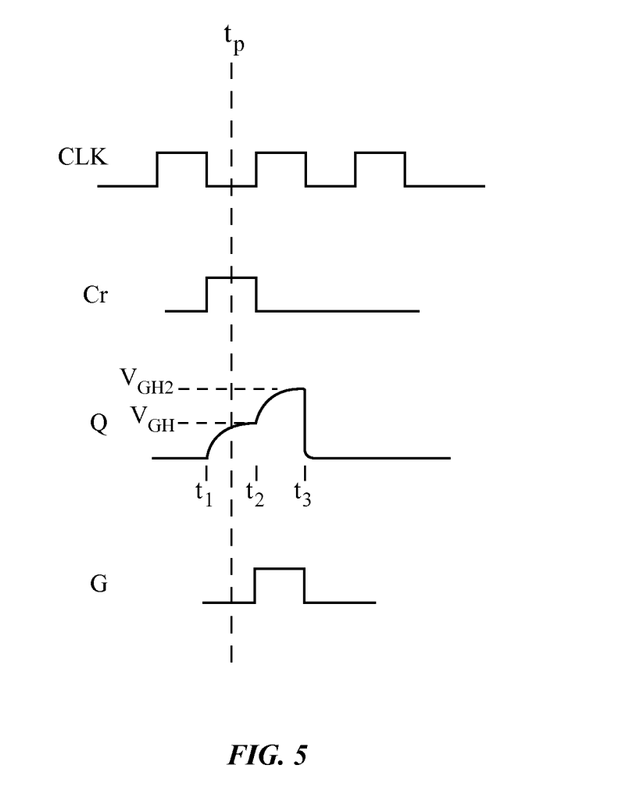
FIG. 5 is a timing diagram showing illustrative signals involved in operating a circuit in accordance with an embodiment.

Operation of circuit 36 in a scenario in which an output signal such as a gate line output is being generated is illustrated in the timing diagram of FIG. 5. In this illustrative scenario, circuit 36 forms part of a gate line driver circuitry in row N of a display.

Clock signal CLK of FIG. 5 may be applied to terminal 40 of circuit 36. Carry signal Cr (e.g., a signal produced by an earlier gate line driver stage in the gate line driver circuitry) is applied to input 38 at time t1. Diode-connected transistor TD allows signals with low-high transitions such as the leading edge of carry signal Cr at time t1 to pass to node Q. Transistor TD will then allow the high signal on node Q that is produced by the high Cr signal to float. At time t1, clock signal CLK goes high. There are parasitic capacitances between the gate of transistor T1 and its source and drain. Through capacitive coupling, the rising clock signal CLK at time t2 cause Q to rise from voltage Vgh to Vgh2 As an example, Q may rise from about 20 volts to about 35 volts (or other suitable voltage). This process is sometimes referred to as bootstrapping. The bootstrapped voltage (35 volts in this example) that is supplied to the gate of transistor T1 will fully turn on transistor T1 and will allow the 20 volts clock signal on terminal 40 to pass to output 42 (as gate line signal G in the present example). Transistor T2 may be turned on to reset node Q. Transistor T3 may be turned on when it is desired to reset output 42. Inputs 46 and 48 may be controlled using signals from control lines or control circuits, using signals that are based on a clock and/or other signals, may use an output signal or other signal from a previous stage in the gate driver circuitry, etc.

In conventional gate driver shift registers, a node such as node Q may be used as memory to store a carry signal during an intraframe pause at time Tp of FIG. 5. This may result in prolonged application of a high voltage to the gate of transistor T1 in a paused shift register stage and therefore unequal transistor stresses through the shift register.

To address this issue, stages 30 of gate line driver circuitry 24 may be provided with both an output block and a carry block that are based on circuit 36. The output block and the carry block can be controlled separately. The output block can be reset at the beginning of an intraframe pause to avoid a persistent high signal Q of different lengths on different output transistors. The carry block may normally produce a carry signal that serves as a trigger signal for later stages in the gate line driver circuitry. These carry signals can be suppressed when initiating an intraframe pause. Memory may be provided in at least some of the stages. The memory can be preloaded with data that can be used to provide trigger signals (carry signals) when restarting the gate line driver circuitry of the display after the end of an intraframe pause.

Figure 6:
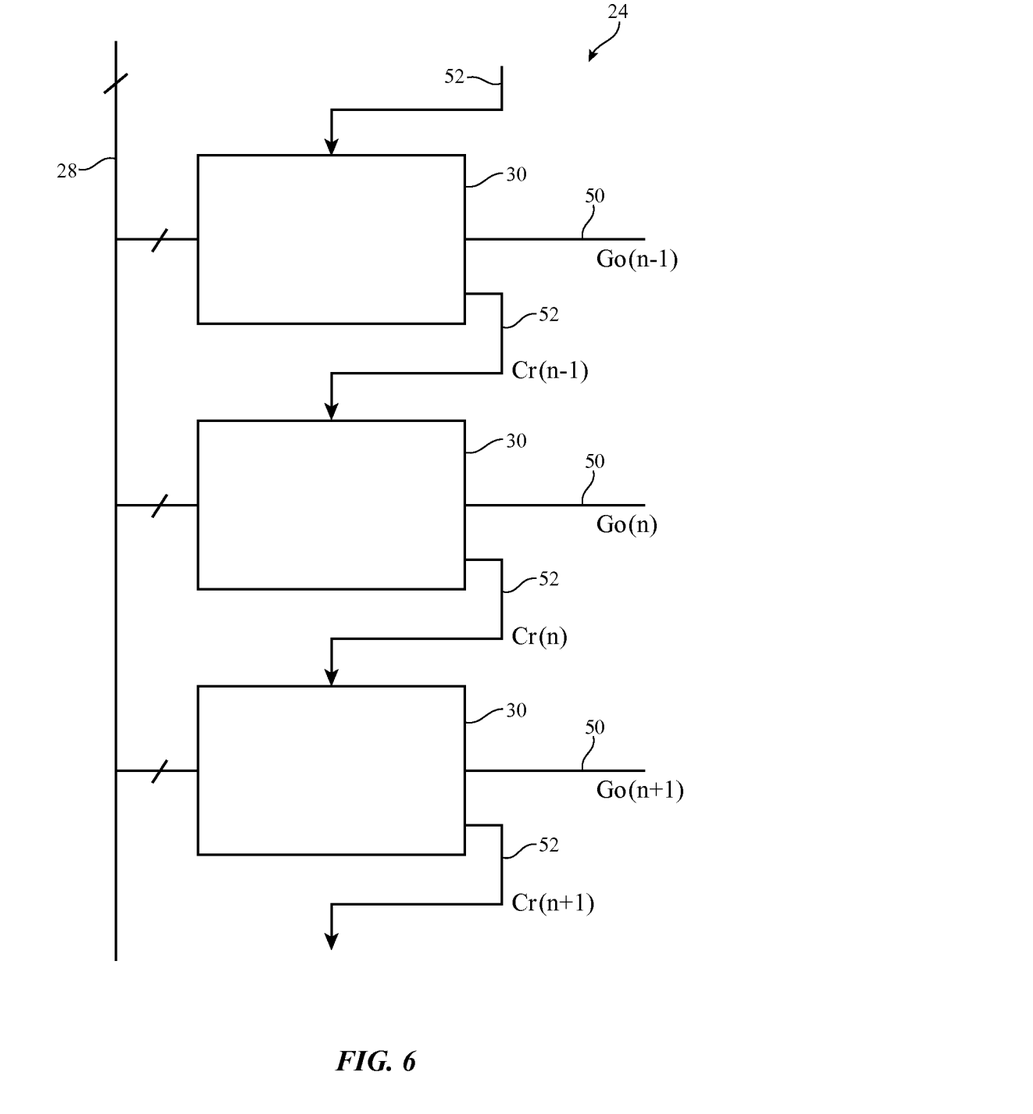
FIG. 6 is a diagram of a portion of a gate line driver circuit having a series of linked gate line driver stages in accordance with an embodiment.

FIG. 6 is a diagram of a portion of gate driver circuitry 22 showing how each gate stage may produce a separate output signal and carry signal. As shown in FIG. 6, each stage 30 may produce a gate line output Go on a corresponding gate line 50 and may produce a carry signal Cr on a corresponding carry line 52. Each carry line 52 may be used to couple a stage 30 to a successive stage 30 in gate driver circuitry 24 (or, in configurations in which multi-phase clocks are used, may be used to couple a stage to a later stage that is not an adjacent stage). Lines 28 may be used to carry clock signals and other control signals to stages 30.

Figure 7:
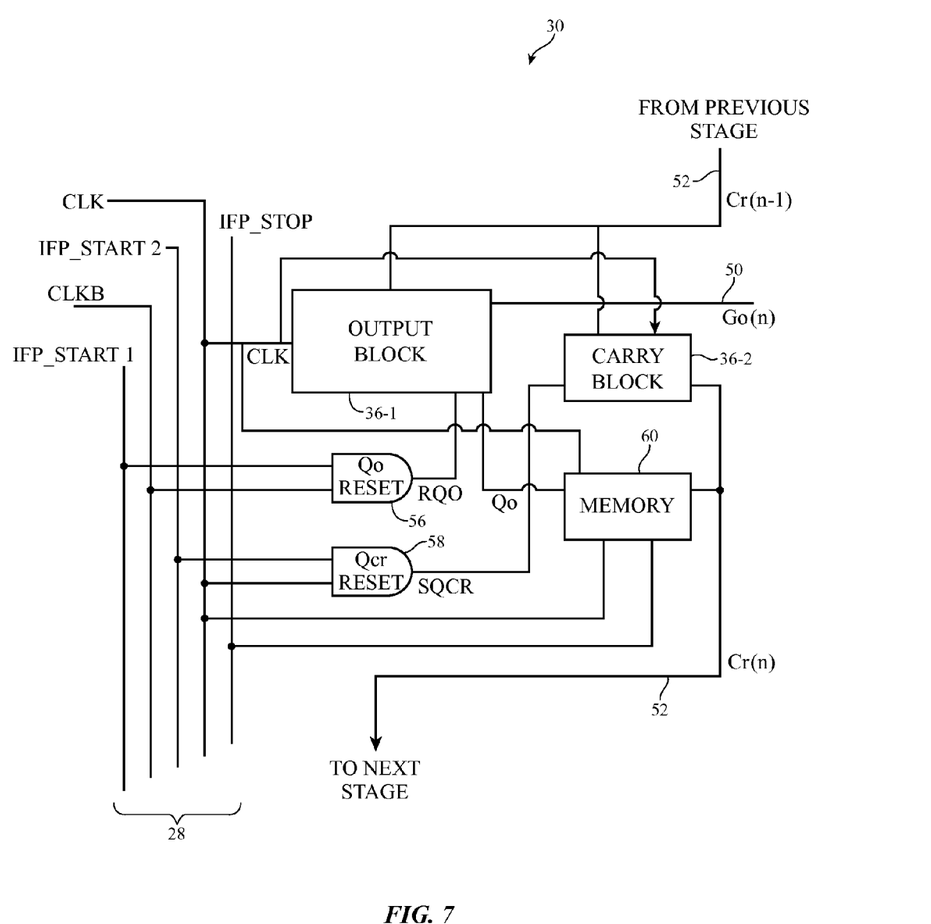
FIG. 7 is a diagram of an illustrative gate line driver stage in accordance with an embodiment.

An illustrative circuit of the type that may be used in each gate stage 30 is shown in FIG. 7. As shown in FIG. 7, gate line driver stage 30 may receive a carry signal Cr from an earlier stage. In the example of FIG. 7, carry signal Cr(n-1) is received from a previous stage over one of carry lines 52. Stage 30 may also provide a carry signal output (carry signal Cr) to a later stage. In the example of FIG. 7, stage 30 is providing carry signal Cr(n) to the next stage in circuitry 24 over one of carry lines 52.

Gate line driver stage 30 includes output block 36-1 and carry block 36-2, each of which may each be based on a circuit such as circuit 36 of FIG. 4. Output block 36-1 may receive carry signal Cr(n-1) (or other carry signal from an earlier stage) and clock CLK on respective input terminals and may produce Go(n) on an output terminal coupled to gate line 50. The internal data node Qo of output block 36-1 may be coupled to memory (memory block) 60. Carry block 36-2 may receive clock CLK and carry Cr(n-1) as inputs and may supply carry output Cr(n) on line 52. Output reset circuit 56 is a logic circuit that may be used to supply reset signals to one or more reset transistors in block 36-1 to reset output Go(n) at the beginning of an intraframe pause period. Reset circuit 56 may be AND gate that receives clock CLKB and intraframe pause start control signal IFP_START1 as inputs and that produces reset signal RQO as an output. Carry reset circuit 58 (e.g., an AND gate that receives clock CLK and intraframe pause start control signal IFP_START2 as inputs and that produces carry suppression control signal SQCR as an output) is a logic circuit that may be used to supply control signals to one or more reset transistors in block 36-2 (e.g., to suppress carry output Cr(n) at the beginning of an intraframe pause period). Control signal IFP_Stop may be used to end an intraframe pause period. Memory 60 may be used to generate carry signals at the ending of a pause. These carry signals may be used to help restart the output and carry blocks in later stages 30.

In the example of FIG. 7, there are two clock signals (e.g., CLK and complementary signal CLKB). This is merely illustrative. Gate driver circuitry 24 and stages 30 may be clocked using any suitable number of clock signals (e.g., two or more, four or more, eight or more, etc.).

In operation, output block 36-1 supplies output signal Go(n) to load data signals D into the pixels of row n of display 14. Carry block 36-2 is an isolated carry generator that is used to trigger the next stage 30. The isolated design of blocks 36-1 and 36-2 minimizes capacitive coupling by the carry signal generated by memory block 60.

Control circuits 56 and 58 control the signals on the internal Q nodes of circuits 36-1 and 36-2 (i.e., signal Qo in block 36-1 and signal Qcr in block 36-2) and equalize Q in time to ensure that transistor gate voltage stresses are equalized.

Memory block 60 stores data signals (Q signals) for use in restarting gate line driver circuitry 24 following intraframe pausing. A capacitor is used as a data storage element in memory block 60. The stored voltage level is higher than clock CLK, so rail-to-rail output is achieved when producing carry signal Cr(n).

Figure 8:
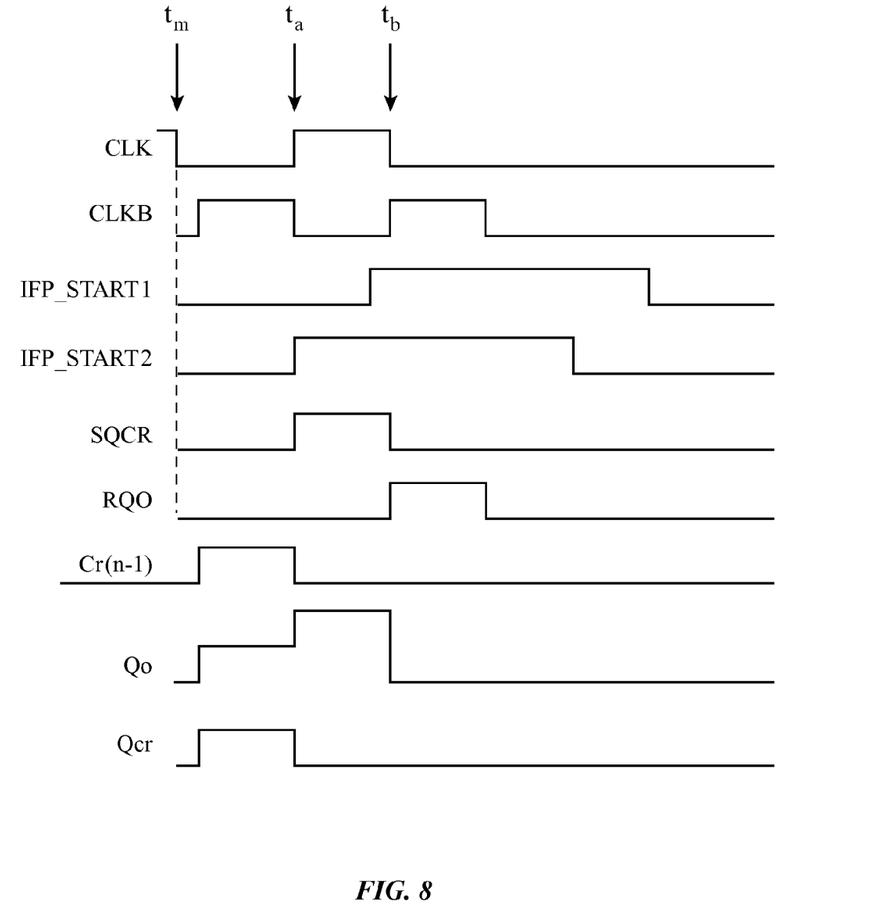
FIG. 8 is a timing diagram showing signals involved in initiating an intraframe pause in accordance with an embodiment.

A timing diagram showing how an intraframe pause operation may be initiated is shown in FIG. 8 (based on an example in which the clock has signals CLK and CLKB). Control signals IFP_START1 and IFP_START2 are used to start an intraframe pause.

At time tm, a carry signal from a previous stage (Cr(n-1)) is received by nth stage 30. When the Cr(n-1) signal is received at the diode-connected transistors at the inputs of blocks 36-1 and 36-2, the signals on nodes Qo and Qcr will rise with rising signal Cr(n-1). At time ta, signal IFP_START2 is asserted and corresponding carry suppression signal SQCR is produced by circuit 58 to reset carry block 36-2 (i.e., to suppress carry signal Qcr). The rising edge of SQCR turns on the Qcr reset transistor in block 36-2 and takes Qcr low. Signal IFP_START1 is asserted at time tb and corresponding reset signal RQO is produced at time tb to reset signal Qo in output block 36-1. The suppression of Qcr prevents subsequent stages 30 from producing high gate line output signals. The forced termination of Qo prevents the output transistors in stages 30 from being stressed unequally during pausing.

A forced termination scheme for Qo may be used in a clocking arrangement with two clock signals (CLK and CLKB) or an arrangement with any other suitable number of clocks. As an example, an arrangement with eight clock signals (e.g., four signals CLK_A, CLK_B, CLK_C, CLK_D, and four corresponding complementary signals CLKB_A, CLKB_B, CLKB_C, CLKB_D) may be used. Configurations of this type may sometimes be referred to as four-phase clock arrangements.

Figure 9:
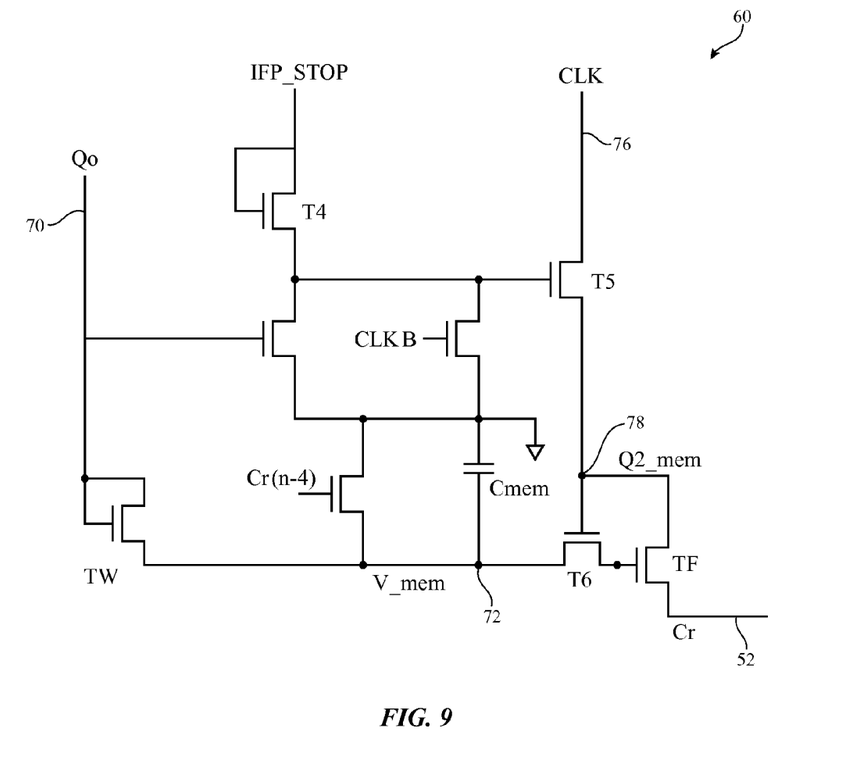
FIG. 9 is a diagram of an illustrative memory circuit that may be used in storing carry signals in a gate line driver stage in accordance with an embodiment.

FIG. 9 is a diagram of an illustrative circuit that may be used for implementing memory block 60 (e.g., in an illustrative configuration with a four-phase clock). To conserve resources, block 60 may, if desired, be implemented only in those rows in which it is desired to retain signals during intraframe pausing. For example, block 60 may be included in the stages 30 of the last four rows in each group of gate lines where a pause is to take place in a four-phase clock arrangement—see, for example, group 32 of FIG. 3.

In these rows of the display, input Q of memory 60 may receive signal Qo from output block 36-1. The voltage of signal Qo may initially be at a first voltage (e.g., 20 volts) and may subsequently rise to a higher second voltage (e.g., 35 volts) due to the bootstrapping circuit that raises Qo in output block 36-1. Diode-connected transistor TW allows the signal on input 70 to be passed to node 72. Accordingly, the value of voltage V_mem may rise to 35 volts (as an example) when memory 60 is loaded with data in connection with an intraframe pause. Loaded data (V_mem) may be stored on a storage element formed from capacitor Cmem. The value of V_mem on node 72 may remain high while memory 60 is retaining loaded data for the duration of the intraframe pause.

Transistors T4 and T5 form a bootstrapping circuit. When signal IFP_STOP is asserted to terminate an intraframe pause, Q1_mem will be loaded with a data signal (e.g., a signal at 20 volts). When CLK is asserted, the value of Q1_mem will be increased (e.g., to 35 volts) through bootstrapping. The elevated value of Q1_mem that is applied to the gate of transistor T5 will ensure that the full voltage of signal CLK on line 76 will be passed to node 78 (i.e., Q2_mem will be taken to 20 volts). The elevated value of V_mem on node 72 (minus the threshold voltage of transistor T6) will be applied to the gate of transistor TF and will ensure that carry signal Cr on output 52 will have its full desired value (i.e., 20 volts in this example). A signal from an earlier stage (e.g., carry signal Cr(n-4) in the example of FIG. 9) may be used to reset the memory.

Figure 10:
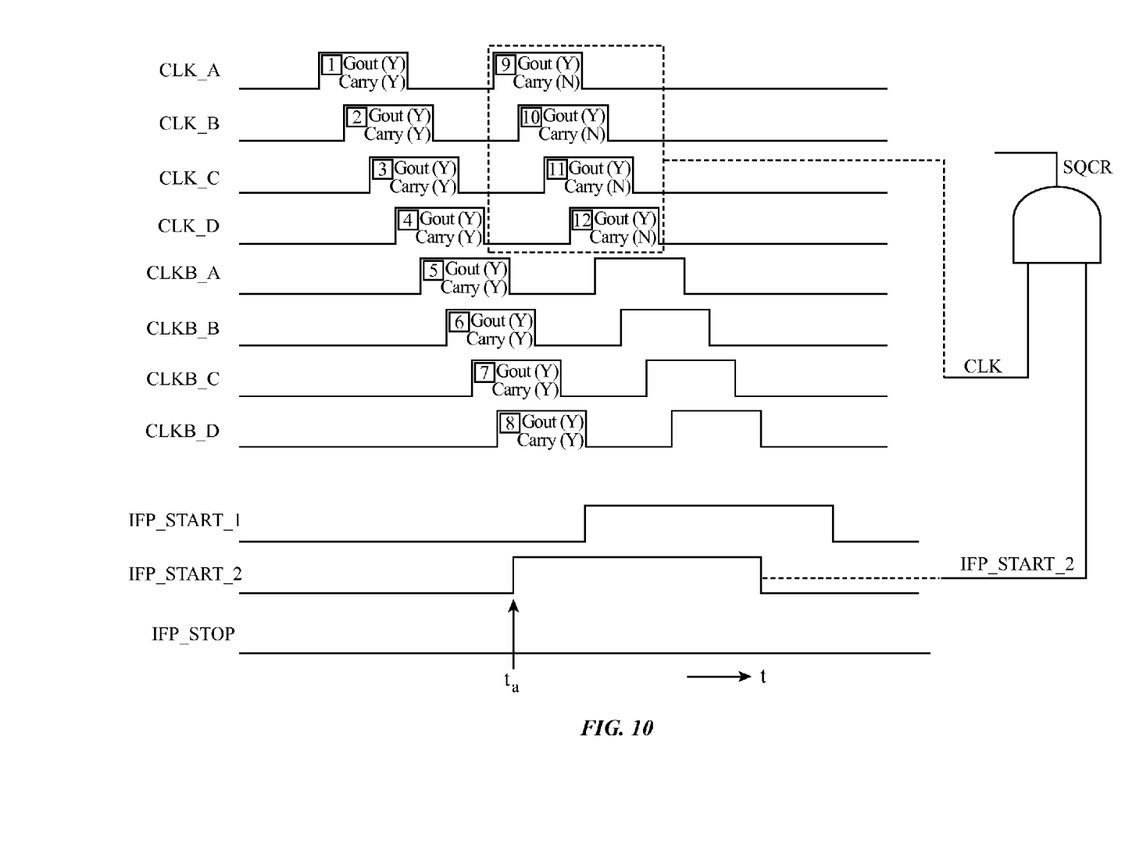
FIG. 10 is a timing diagram showing operations associated with generating a carry suppress signal to suppress carry signal generation when an intraframe pause is being initiated in accordance with an embodiment.
Figure 11:
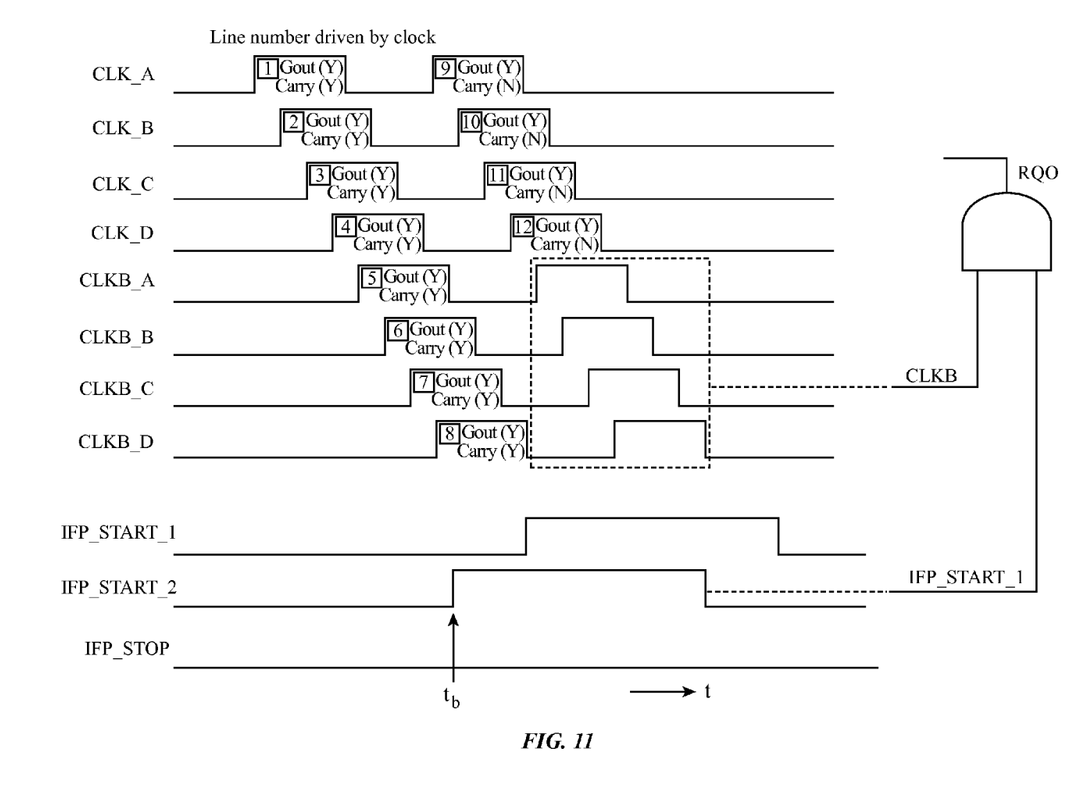
FIG. 11 is a timing diagram showing operations associated with generating a reset signal to ensure that output block transistors in gate line driver stages are turned off before intraframe pausing and therefore have equal transistor stresses in accordance with an embodiment.
Figure 12:
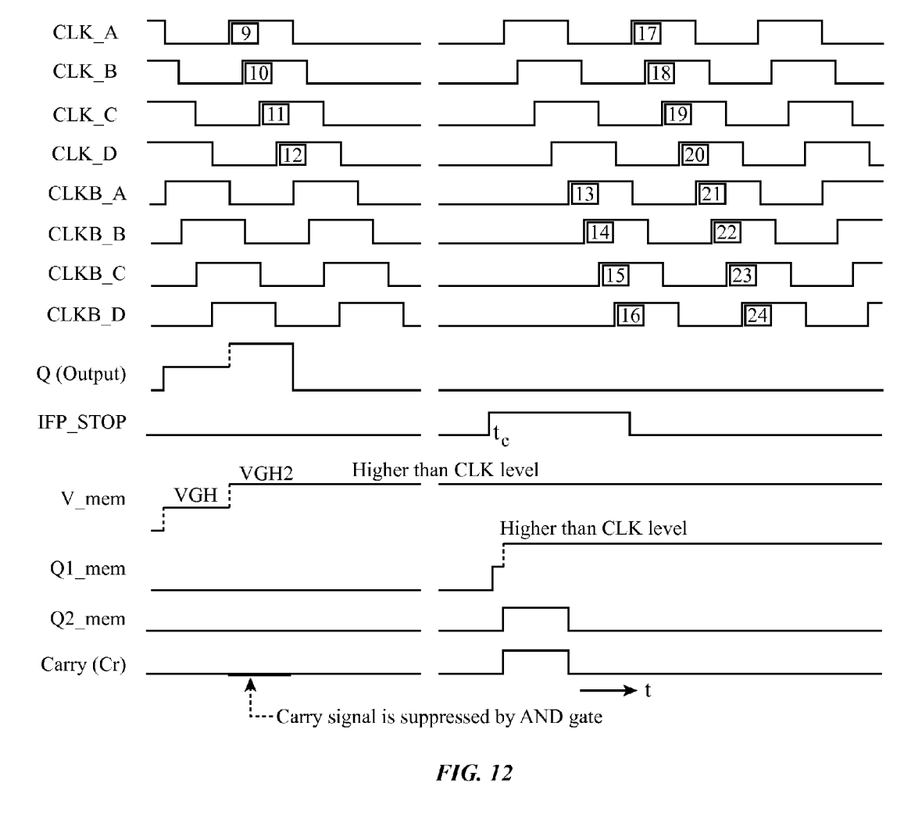
FIG. 12 is a timing diagram showing operations associated with ending an intraframe pause in accordance with an embodiment.

FIGS. 10, 11, and 12 show how intraframe pausing may be initiated (FIGS. 10 and 11) and terminated (FIG. 12). In the illustrative example of FIGS. 10, 11, and 12, there are eight clock signals (CLK_A, CLK_B, CLK_C, CLK_D, CLKB_A, CLKB_B, CLKB_C, CLKB_D) being applied to gate line driver stages 30. Labels 80 represent the line (row) number of each line in a portion of display 14.

In the example of FIG. 10, stages 30 in lines 1 to 8 are being controlled normally and each produce a corresponding gate line output Go (Gout) for a respective row of pixels in display 14 (e.g., to control the first eight rows of pixels in display 14 in this example). After the eighth gate line has been asserted (in this example), signals IFP_START1 and IFP_START2 are used to initiate an intraframe pause. As shown in FIG. 10, IFP_START2 is asserted at time ta, which, in conjunction with clocks CLK_A, CLK_B, CLK_C, CLK_D, generates carry suppression signals SQCR and suppresses the production of the carry signals Cr in stages 30 of lines 9, 10, 11, and 12.

In lines 1 to 8, Qo and Qcr behave identically. But after time ta, the circuits of output block 36-1 and carry block 36-2 are controlled separately and signals Qo and Qcr behave differently. In particular, in lines 9-12 the signals Qo are used by output blocks 36-1 to generate output signal Go on gate lines 50, whereas the signals Qcr are suppressed. Because the carry signals Cr are suppressed, these carry signals are not passed to the four stages 30 at the beginning of the next group of lines in display 14 (e.g., group 34 in the example of FIG. 3). The suppression of the carry signals is therefore effective at pausing the generation of additional gate output signals until the intraframe pause is stopped.

In addition to suppressing the generation of carry signals Cr at the end of group 32, the IFP_START1 control signal is used (at time tb) to individually turn off signals Qo in output blocks 36-1 of the last four lines of group 32 to prevent unequal transistor stresses, as shown in FIG. 11. For example, signal CLKB_A and IFP_START1 generate a reset signal RQO that turns off Qo in line 9 at the rising edge of CLKA, etc.

Once all of the gate line outputs in group 32 have been turned off (including the outputs in the last four stages) and after the carry signals of the last four stages have been suppressed, the gate driver circuitry of display 14 will have been effectively paused (i.e., an intraframe pause will have been started). Display driver circuitry (e.g., circuitry 22 of FIG. 2) can maintain the intraframe pause for an amount of time suitable to allow touch sensor signals to be gathered from the touch sensor electrode array in display 14 (e.g., hundreds of microseconds).

The timing diagram of FIG. 12 illustrates operations involved with terminating an intraframe pause. In the example of FIG. 12, the production of carry signals Cr was suppressed for lines 9-12 (as part of the process of initiating the intraframe pause). Following a desired intraframe pause period, signal IFP_STOP may be asserted (time tc). The carry signals that would normally have been produced by lines 9-12 were suppressed while associated data signals were stored in memory 60 in lines 9-12 as part of the process of initiating the intraframe pause (i.e., when output data Qo was loaded onto capacitor Cmem in each memory 60). When it is time to restart the gate line output signals (i.e., terminate intraframe pausing), the loaded data in memory 60 in these four stages serves as trigger signals for bootstrapping operations in the first four stages of the next group of gate line driver stages 30 (e.g., the first four rows of group 34 of FIG. 3—lines 13-16 in the example of FIG. 12). In particular, when IFP_STOP is asserted at time tc, the preloaded signals in the memory 60 of lines 9-12 can be used in conjunction with clocks signals CLKB_A, CLKB_B, CLKB_C, and CLKB_D to produce gate line output signals Go in lines 13 to 16. The stored signals in memory blocks 60 serve as substitute carry signals (which are not available from their normal source—the carry blocks in earlier stages—because the carry outputs of these stages were suppressed for the pause). Using the stored signals in memory 60, carry signals Cr may also be produced (e.g., at outputs such as line 52 of FIG. 9), so that the stages in later rows (e.g., lines 17 and higher in the example of FIG. 12) may likewise produce appropriate gate line output signals Go (i.e., so that the operation of the shift register formed by stages 30 can operate normally).

Intraframe pauses may be performed at fixed gate line locations (e.g., by providing certain stages 30 at the end of each group of lines with memory 60 and control logic 56 and 58) to conserve circuit resources. If desired, display 14 may be provided with the resources to support intraframe pausing at any general (unspecified) row location (e.g., by providing all stages 30 with memory 60 and control logic 56 and 58 to support pausing).

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   an array of pixels that receive data over data lines and that are controlled by gate line signals on gate lines to display frames of image data;
   gate line driver circuitry having shift register circuitry with gate line driver stages that produce the gate lines signals; and
   display driver circuitry that controls the gate line driver circuitry for intraframe pausing of the gate line driver circuitry, wherein at least some of the gate line driver stages comprises:
   circuitry that separately controls output data and carry data; and
   a memory block that is coupled to the circuitry and that stores and supplies the carry data.

2. The display defined in claim 1 wherein the circuitry comprises an output block in each gate line driver stage that uses the output data to produce the gate line signal for that gate line driver stage.

3. The display defined in claim 2 wherein the circuitry comprises a carry block in each gate line driver stage that is controlled independently of the output block in that gate line driver stage and that produces a carry signal for that gate line driver stage on a carry line.

4. The display defined in claim 3 wherein each memory block is coupled a respective output block and stores the output data for that output block.

5. The display defined in claim 4 wherein the output data is stored in each of the memory blocks in response to an intraframe pause start signal generated by the display driver circuitry to initiate intraframe pausing.

6. The display defined in claim 5 wherein each memory block supplies a carry signal that is used to reinitiate gate line output from the gate line driver stages when stopping the intraframe pausing.

7. The display defined in claim 6 further comprising:
   a logic circuit in each gate line driver stage with a memory block, wherein the logic circuit produces a reset signal that resets the output data in each output block so that all gate line driver stages experience equal transistor stresses during the intraframe pausing.

8. The display defined in claim 6 further comprising:
   a logic circuit in each gate line driver stage with a memory block, wherein the logic circuit of each gate line driver stage is coupled to the carry block in that gate line driver stage and produces a carry data suppression signal that suppresses generation of the carry data by that carry block.

9. The display defined in claim 6 wherein each gate line driver stage with a memory block further comprises:
   a first logic circuit that produces a reset signal that resets the output data in the output block of that gate line driver stage; and
   a second logic circuit that produces a carry data suppression signal that suppresses generation of the carry data by the carry block in that gate line driver stage.

10. The display defined in claim 9 wherein each memory block further comprises a capacitor that stores the output data for that memory block.

11. The display defined in claim 10 further comprising:
    a touch sensor that gathers touch data during intraframe pausing.

12. The display defined in claim 11 wherein each output block comprises:
    a clock input; and
    a carry signal input.

13. The display defined in claim 12 wherein each output block comprises bootstrapping circuitry that produces a signal in response to the clock input and the carry signal input.

14. The display defined in claim 11 wherein each carry block comprises:
    a clock input; and
    a carry signal input.

15. The display defined in claim 14 wherein each carry block comprises bootstrapping circuitry that produces a signal in response to the clock input and the carry signal input.

16. A display, comprising:
    an array of pixels that receive data over data lines and that are controlled by gate line signals on gate lines to display frames of image data;
    gate line driver circuitry having shift register circuitry with gate line driver stages that produce the gate lines signals; and
    display driver circuitry that controls the gate line driver circuitry for intraframe pausing of the gate line driver circuitry, wherein at least some of the gate line driver stages include a separately controlled output block and carry block, wherein the output block produces output data and the carry block produces carry data, and wherein the output data is generated and the carry data is suppressed during the intraframe pausing.

17. The display defined in claim 16 wherein at least some of the gate line driver stages include a memory having a capacitor that stores data.

18. The display defined in claim 17, wherein each output block comprises first and second inputs, wherein each carry block comprises third and fourth inputs, wherein the first and third inputs receive a common carry signal, wherein the second and fourth inputs receive a common clock signal, and wherein the display further comprises a touch sensor that overlaps the array of pixels and that gathers touch sensor data during the intraframe pausing of the gate line driver circuitry.

19. Circuitry, comprising:
    rows and columns of pixels, wherein each column has an associated data line that conveys data signals to the pixels of that column and wherein each row has a gate line that supplies gate line signals to the pixels of that row; and gate line driver circuitry having stages each of which provides a corresponding one of the gate line signals to a respective one of the gate lines, wherein each stage of the gate line driver circuitry has first and second independently controlled circuit blocks, wherein the first circuit block in each stage produces a respective one of the gate line signals, wherein the second circuit block in each stage produces a carry signal, wherein the first circuit block receives a first reset signal on a first reset line and the second circuit block receives a second reset signal on a second reset line that is different than the first reset line, wherein the first reset signal resets the first circuit block, and wherein the second reset signal resets the second circuit block.

20. The circuitry defined in claim 19 wherein at least some of the stages further comprise:
   a memory that stores signals from the first circuit block;
   a first circuit that generates the first reset signal that resets the gate line signal for the first circuit block; and
   a second circuit that generates the second reset signal that suspends production of the carry signal by the second circuit block.

\* \* \* \* \*